United States Patent
Song et al.

(10) Patent No.: US 7,932,102 B2
(45) Date of Patent: Apr. 26, 2011

(54) PHASE CHANGE MEMORY AND METHOD OF FABRICATING THE SAME

(75) Inventors: Yoon-Jong Song, Seoul (KR);
Byung-Seo Kim, Suwon-si (KR);
Kyung-Chang Ryoo, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 187 days.

(21) Appl. No.: 12/314,884

(22) Filed: Dec. 18, 2008

(65) Prior Publication Data

US 2009/0163023 A1    Jun. 25, 2009

(30) Foreign Application Priority Data

Dec. 20, 2007  (KR) .................. 10-2007-0134350

(51) Int. Cl.
*H01L 21/00* (2006.01)
*H01L 21/44* (2006.01)
*H01L 21/31* (2006.01)
*H01L 21/469* (2006.01)

(52) U.S. Cl. ............................ 438/3; 438/652; 438/787

(58) Field of Classification Search .............. 438/3, 652, 438/787; 257/E21.161
See application file for complete search history.

(56) References Cited

U.S. PATENT DOCUMENTS

| 5,856,707 | A  | * | 1/1999  | Sardella .................... 257/758 |
| 6,995,388 | B2 |   | 2/2006  | Hwang et al. |
| 2005/0118829 | A1 | * | 6/2005  | Lee et al. .................. 438/714 |
| 2006/0281216 | A1 | * | 12/2006 | Chang et al. ................. 438/102 |
| 2007/0012906 | A1 | * | 1/2007  | Kim et al. .................... 257/3 |
| 2007/0020934 | A1 | * | 1/2007  | Gaidis et al. ................. 438/689 |
| 2007/0045606 | A1 |   | 3/2007  | Magistretti et al. |

FOREIGN PATENT DOCUMENTS

| JP | 2004-158852 | 6/2004 |
| KR | 10-1998-014482 A | 5/1998 |
| KR | 10-2004-0038422 A | 5/2004 |
| KR | 10-2007-0026157 A | 3/2007 |
| KR | 10-2007-0034323 A | 3/2007 |

* cited by examiner

*Primary Examiner* — William M. Brewster
(74) *Attorney, Agent, or Firm* — Lee & Morse, P.C.

(57) ABSTRACT

A method of fabricating a phase change memory includes forming a lower electrode on a semiconductor substrate, forming a phase change pattern, an upper electrode, and a hard mask pattern sequentially on the lower electrode, a width of a bottom surface of the hard mask pattern being greater than a width of a top surface of the hard mask pattern, the bottom surface of the hard mask pattern facing the upper electrode and being opposite the top surface of the hard mask pattern, and forming a capping layer to cover the top surface of the hard mask pattern and sidewalls of the hard mask pattern, phase change pattern, and upper electrode.

16 Claims, 4 Drawing Sheets

PHASE CHANGE MEMORY AND METHOD OF FABRICATING THE SAME

BACKGROUND OF THE INVENTION

1. Field of the Invention

Example embodiments relate to a semiconductor device and to a method of fabricating the same. More particularly, example embodiments relate to a phase change memory and to a method of fabricating the same.

2. Description of the Related Art

Electronic industries, e.g., a mobile communication industry, a computer industry, and so forth, may require semiconductor devices exhibiting, e.g., a relatively fast read/write operation speed, non-volatility, low operation voltage, and so forth. Semiconductor devices may include memory devices, e.g., static random access memory (SRAM) devices, dynamic random access memory (DRAM) devices, flash memory devices, phase random access memory (PRAM) devices, and so forth.

A PRAM may satisfy the above characteristics required in a semiconductor device. For example, since the PRAM may be capable of performing information changes of more than about $10^{13}$, its durability may be excellent. Additionally, the PRAM may have a high operation speed of about 30 ns.

A conventional PRAM may include a phase change layer that changes its crystal state, i.e., amorphous or crystallized, with respect to heat, e.g., heating temperature and/or time. For example, as illustrated by curve 1 of FIG. 1, when the phase change layer of the PRAM is heated at a temperature higher than a melting temperature (Tm) for a first duration T1, followed by cooling, the phase change layer may become amorphous. In another example, as illustrated by curve 2 of FIG. 1, when the phase change layer of the PRAM is heated at a temperature lower than Tm and higher than a crystallization temperature Tc for a second duration T2 longer than the first duration T1, followed by cooling, the phase change layer may be crystallized. The crystal state of the phase change layer may affect an electrical resistance thereof, e.g., a crystallized phase change layer may have a resistance of about several KΩ and an amorphous phase change layer may have a resistance of about hundreds KΩ, so information stored in a memory cell of the PRAM may be read by sensing a change of electrical resistance of the phase change layer.

Since electrical resistance of the phase change layer is important for controlling operation of the PRAM, stable control of physical properties of the phase change layer may be required during manufacturing of the PRAM, e.g., control of process temperature or impurity diffusion. For example, a manufacturing method of a conventional PRAM may include forming a capping layer on the phase change layer in order to prevent impurity, e.g., oxygen, diffusion into the phase change layer.

The conventional capping layer of the PRAM may be formed at a temperature lower than a transition temperature of the phase change layer to avoid affecting electrical properties of the phase change layer. For example, the conventional capping layer may be formed by a physical vapor deposition (PVD) method. However, a layer formed via a PVD method may exhibit, e.g., reduced step coverage, poor density, and lower quality, as compared to layers formed via other deposition methods. As a result, a conventional capping layer of a PRAM formed via a PVD method may have non-uniform thickness, e.g., upper portions of the capping layer may be thicker than lower portions of the capping layer, thereby limiting thickness of the capping layer and reducing integration degree of the PRAM.

SUMMARY OF THE INVENTION

Example embodiments are therefore directed to a PRAM and to a method of forming the same, which substantially overcome one or more of the disadvantages and shortcomings of the related art.

It is therefore a feature of an example embodiment to provide a PRAM with a capping layer having a substantially uniform thickness.

It is another feature of an example embodiment to provide a PRAM with a capping layer having an increased thickness and capable of efficiently preventing oxygen from penetrating therethrough.

It is yet another feature of an example embodiment to provide a method of forming a PRAM having one or more of the above features.

At least one of the above and other features and advantages of the present invention may be realized by providing a method of fabricating a phase change memory, including forming a lower electrode on a semiconductor substrate, forming a phase change pattern, an upper electrode, and a hard mask pattern sequentially on the lower electrode, a width of a bottom surface of the hard mask pattern being greater than a width of a top surface of the hard mask pattern, the bottom surface of the hard mask pattern facing the upper electrode and being opposite the top surface of the hard mask pattern, and forming a capping layer to cover the top surface of the hard mask pattern and sidewalls of the hard mask pattern, phase change pattern, and upper electrode.

The capping layer may be formed at a temperature lower than a transition temperature of the phase change pattern. The capping layer may be formed using a physical vapor deposition method. The phase change pattern may be formed of a chalcogen compound, the chalcogen compound including one or more of antimony (Sb), tellurium (Te), and selenium (Se), and the capping layer may be formed of at least one insulation material capable of preventing oxygen diffusion. Forming the hard mask pattern may include gradually narrowing the width of the hard mask pattern from the bottom surface to the top surface as a distance from a top surface of the upper electrode increases. Forming the hard mask pattern may include forming a hard mask pattern with inclined sidewalls, each sidewall extending between the top and bottom surfaces of the hard mask pattern, and an inclination angle between each sidewall to the bottom surface of the hard mask pattern may be about 30 degrees to about 60 degrees. Forming the phase change pattern, the upper electrode, and the hard mask pattern may include sequentially forming a phase change layer, an upper electrode layer, and a hard mask layer on the lower electrode, patterning the hard mask layer to form the hard mask pattern with the bottom surface wider than the top surface, and patterning the upper electrode layer and the phase change layer using the hard mask pattern as an etch mask, wherein an etchant used for patterning the hard mask layer may be different from an etchant used for patterning the upper electrode layer and the phase change layer.

Patterning the hard mask layer may include over-etching the hard mask layer to form the hard mask pattern having the bottom surface wider than the top surface without exposing a top surface of the phase change layer. The hard mask layer may be formed of a silicon oxide, and patterning the hard mask layer may include etching the hard mask layer under a pressure condition of about 10 mT to about 50 mT and a power condition of about 100 W to about 2000 W in a gas atmosphere including hexafluoro-1,3-butadiene ($C_4F_6$), oxygen, and argon. A thickness of the capping layer on sidewalls of the hard mask pattern, phase change pattern, and upper electrode may be substantially uniform, the thickness being measured along a direction parallel to a line connecting two adjacent hard mask patterns. A difference between a thickness of a portion of the capping layer on a sidewall of the hard mask pattern and a thickness of a portion of the capping layer on a sidewall of the phase change pattern may be about 25% of the thickness of the portion of the capping layer on the sidewall of the hard mask pattern or less, the thickness being measured along a direction parallel to a line connecting two adjacent hard mask patterns. The capping layer may be formed to have a top surface profile corresponding to a surface profile of the top surface of the hard mask pattern.

At least one of the above and other features and advantages of the present invention may be realized by providing a phase change memory, including a lower electrode on a semiconductor substrate, a phase change pattern, an upper electrode, and a hard mask pattern sequentially stacked on the lower electrode, a width of a bottom surface of the hard mask pattern being greater than a width of a top surface of the hard mask pattern, the bottom surface of the hard mask pattern facing the upper electrode and being opposite the top surface of the hard mask pattern, and a capping layer on the top surface of the hard mask pattern and on sidewalls of the hard mask pattern, phase change pattern, and upper electrode.

The capping layer may include an insulation material capable of preventing oxygen diffusion. The capping layer may include a silicon nitride and the phase change pattern may include a chalcogen compound, the chalcogen compound including one or more of antimony (Sb), tellurium (Te), and selenium (Se). The width of the hard mask pattern may narrow gradually from the bottom surface to the top surface as a distance from a top surface of the upper electrode increases. An angle of inclination between the sidewall of the hard mask pattern and the bottom surface of the hard mask pattern may be about 30 degrees to about 60 degrees. A difference between a thickness of a portion of the capping layer on a sidewall of the hard mask pattern and a thickness of a portion of the capping layer on a sidewall of the phase change pattern may be about 25% of the thickness of the portion of the capping layer on the sidewall of the hard mask pattern or less, the thickness being measured along a direction parallel to a line connecting two adjacent hard mask patterns.

BRIEF DESCRIPTION OF THE DRAWINGS

The above and other features and advantages will become more apparent to those of ordinary skill in the art by describing in detail example embodiments with reference to the attached drawings, in which.

DETAILED DESCRIPTION OF THE INVENTION

Figure 1:
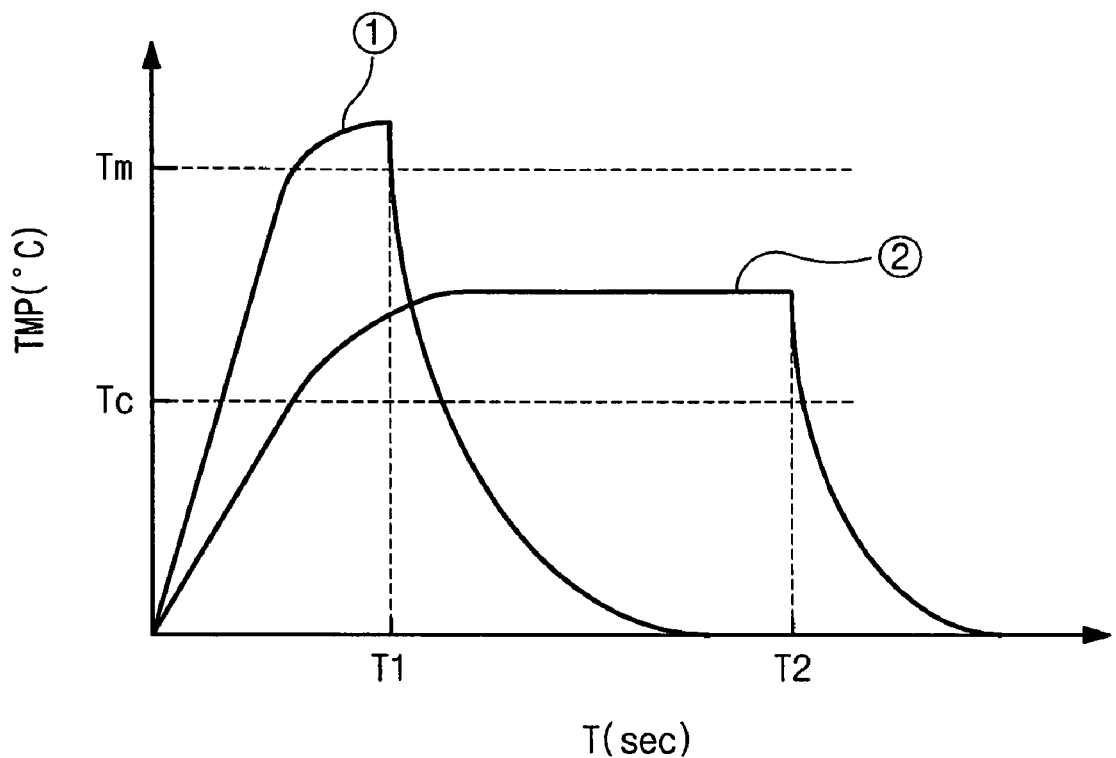
FIG. 1 illustrates a graph of a crystalline state of a phase change layer according to time and temperature.

Korean Patent Application No. 10-2007-0134350, filed on Dec. 20, 2007, in the Korean Intellectual Property Office, and entitled: "Phase Change Memory and Method of Fabricating the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the terms "a" and "an" are open terms that may be used in conjunction with singular items or with plural items.

Further, terms like "first," "second," and "third" may be used to describe various regions and layers in various embodiments of the present invention, and the described regions and the layers may not be limited to these terms. These terms are used only to tell one region or layer from another region or layer. Therefore, a layer referred to as a first layer in one embodiment can be referred to as a second layer in another embodiment. An embodiment described and exemplified herein includes a complementary embodiment thereof.

FIGS. 3-6 illustrate cross-sectional views of sequential stages in a process of fabricating a phase change memory according to an example embodiment.

Figure 3:
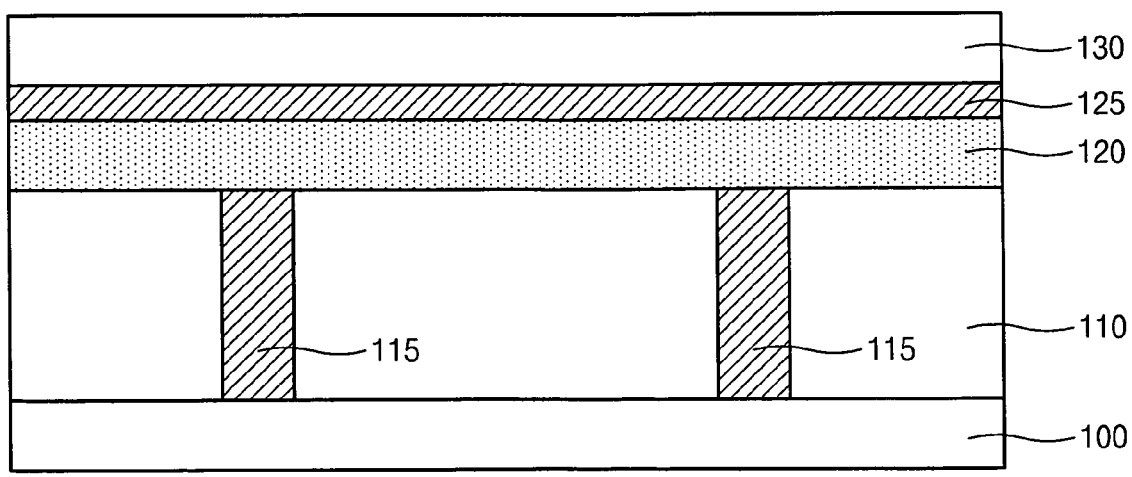
FIGS. 3-6 illustrate cross-sectional views of sequential stages in a process of fabricating a PRAM according to an example embodiment.

Referring to FIG. 3, a lower interlayer dielectric 110 may be formed on a semiconductor substrate 100, and a lower electrode 115 may be formed in the lower interlayer dielectric 110, e.g., the lower electrode 115 may penetrate through the lower interlayer dielectric 110. Various active devices (not shown), e.g., a transistor, a diode, and so forth, may be disposed between the lower interlayer dielectric 110 and the semiconductor substrate 100. Some of the various active devices may be electrically connected to the lower electrode 115.

A phase change layer 120 may be formed on the lower interlayer dielectric 110, and may be in contact with the lower electrode 115. For example, top surfaces of the lower interlayer dielectric 110 and lower electrode 115 may be substantially level, and the phase change layer 120 may be deposited to be in direct contact with both the lower interlayer dielectric 110 and the lower electrode 115, as illustrated in FIG. 3. The phase change layer 120 may be formed of a chalcogen compound, e.g., one or more of antimony (Sb), tellurium (Te), selenium (Se), and germanium (Ge). For example, the phase change layer 120 may include a chalcogen compound including Te in a concentration of about 20 atomic percent (at %) to about 80 at %, Sb in a concentration of about 5 at % to about 50 at %, and a remainder of Ge.

An upper electrode layer 125 may be formed on the phase change layer 120, e.g., the upper electrode layer 125 may cover an entire top surface of the phase change layer 120. The lower electrode 115 and the upper electrode layer 125 may be respectively formed of one or more of a nitride including metal elements, an oxynitride including metal elements, carbon (C), titanium (Ti), tantalum (Ta), titanium aluminum (TiAl), zirconium (Zr), hafnium (Hf), molybdenum (Mo), aluminum (Al), aluminum-copper (Al—Cu), aluminum-copper-silicon (Al—Cu—Si), copper (Cu), tungsten (W), titanium-tungsten (TiW), and tungsten silicide ($WSi_x$). Examples of suitable nitrides with metal elements may include one or more of TiN, TaN, WN, MoN, NbN, TiSiN, TiAlN, TiBN, ZrSiN, WSiN, WBN, ZrAlN, MoSiN, MoAlN, TaSiN, and TaAlN. Examples of suitable oxynitrides with metal elements may include one or more of TiON, TiAlON, WON, and TaON.

A hard mask layer 130 may be formed on the upper electrode layer 125, e.g., the hard mask layer 130 may be on an entire top surface of the upper electrode layer 125. The hard mask layer 130 may be formed of any suitable material having an etch selectivity with respect to the upper electrode layer 125 and the phase change layer 120. In other words, the hard mask layer 130 may be formed of a material having a lower etching speed than etching speeds of the materials forming the upper electrode layer 125 and the phase change layer 120. For example, the hard mask layer 130 may be formed of a silicon oxide, e.g., a plasma enhanced oxide (PEOX).

Figure 4:
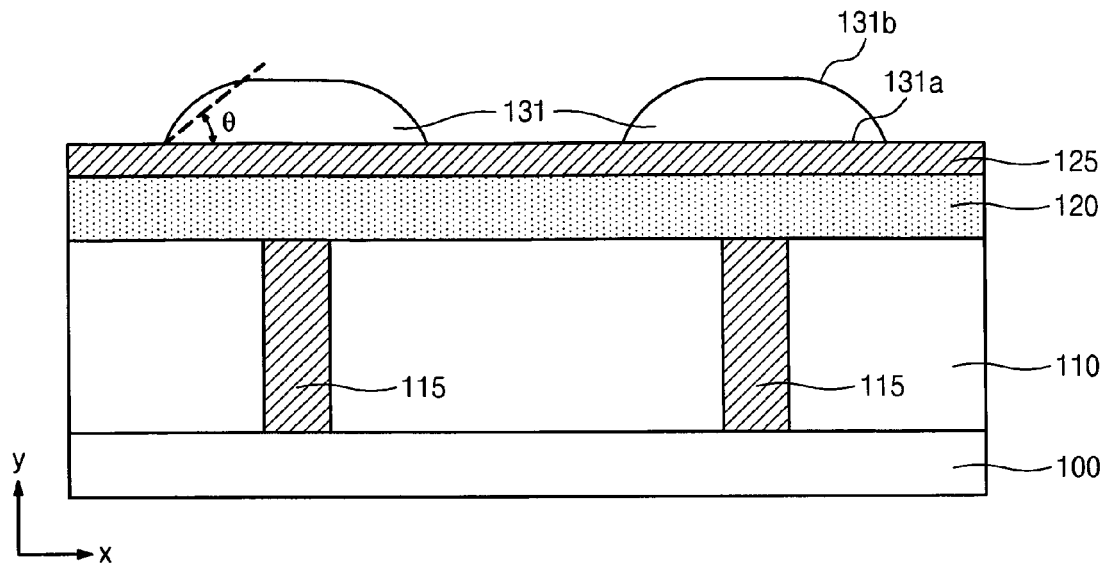

Referring to FIG. 4, the hard mask layer 130 may be patterned to form at least one hard mask pattern 131. The hard mask layer 130 may be patterned by, e.g., an etching process, as will be described in more detail below. The phase change memory may include a plurality of hard mask patterns 131 spaced apart from each other on the upper electrode layer 125, as illustrated in FIG. 4.

As further illustrated in FIG. 4, the hard mask pattern 131 may cross over the lower electrode 115, e.g., the hard mask pattern 131 may completely overlap the lower electrode 115. For example, the hard mask pattern 131 may be positioned on the lower electrode 115, such that the lower electrode 115 may be aligned with a vertical center axis, i.e., an axis along the y-axis, of the hard mask pattern 131.

The hard mask pattern 131 may have a lower width greater than an upper width, as illustrated in FIG. 4. More specifically, a width, i.e., a distance along the x-axis, of a bottom surface 131a of the hard mask pattern 131, i.e., a surface facing the upper electrode layer 125, may be larger than a width of a top surface 131b of the hard mask pattern 131, i.e., a surface opposite the bottom surface and facing away from the upper electrode layer 125. For example, a distance along the x-axis between opposite sidewalls of the hard mask pattern 131, i.e., surfaces connecting top and bottom surfaces of the hard mask pattern 131, may gradually decrease as a distance from the upper electrode layer 125 increases, i.e., the hard mask 131 may gradually become narrower in a direction away from a top surface of the upper electrode layer 125. Thus, the hard mask pattern 131 may have inclined sidewalls, e.g., at an inclination angle θ as measured between each sidewall of the hard mask pattern 131 and the bottom surface 131a of the hard mask pattern 131, as illustrated in FIG. 4. The inclination angle θ may range from about 30 degrees to about 60 degrees.

A region in which the sidewalls of the hard mask pattern 131 connect with the top surface 131b of the hard mask pattern 131 may have a larger radius of curvature than a curvature at an intersection region of the sidewalls with the bottom surface 131a of the hard mask pattern 131. As a result, the region where the sidewalls of the hard mask pattern 131 connect with the top surface 131b of the hard mask pattern 131 may be rounded, i.e., a rounded sidewall shape, as further illustrated in FIG. 4.

The inclined or rounded sidewalls, i.e., side surfaces, of the hard mask pattern 131 may be realized by adjusting an etchant in the etching process. For example, if the hard mask layer 130 is formed of PEOX, a plasma dry etching process using hexafluoro-1,3-butadiene ($C_4F_6$), oxygen ($O_2$), and argon (Ar) as an etchant, i.e., process gas, may be used for patterning the hard mask layer 130. For example, the process gas may include $C_4F_6$, $O_2$, and Ar in an atomic ratio of about 20:17:400. According to an example embodiment, in the plasma dry etching process, a chamber pressure may range from about 10 mT to about 50 mT, and a plasma power may range from about 100 W to about 2000 W.

It is noted that when a plasma dry etching process is used for patterning the hard mask pattern 131, the upper electrode layer 125 may be over-etched, i.e., a portion of a top surface of the upper electrode layer 125 may be recessed to a predetermined depth along the y-axis. However, even though a portion of the upper electrode layer 125 may be over-etched, a top surface of the phase change layer 120 according to an example embodiment may not be exposed during the etching process of the hard mask pattern 131. For example, the etchant of the plasma dry etching process may be adjusted so when portions of the hard mask layer 130 are removed to form the hard mask pattern 131, only about 10% to about 20% of a deposited thickness, i.e., a distance as measured along the y-axis, of the upper electrode 125 may be removed. Accordingly, the phase change layer 120 may not be exposed during formation of the hard mask pattern 131, thereby preventing or substantially minimizing damage to the phase change layer 120.

Figure 5:
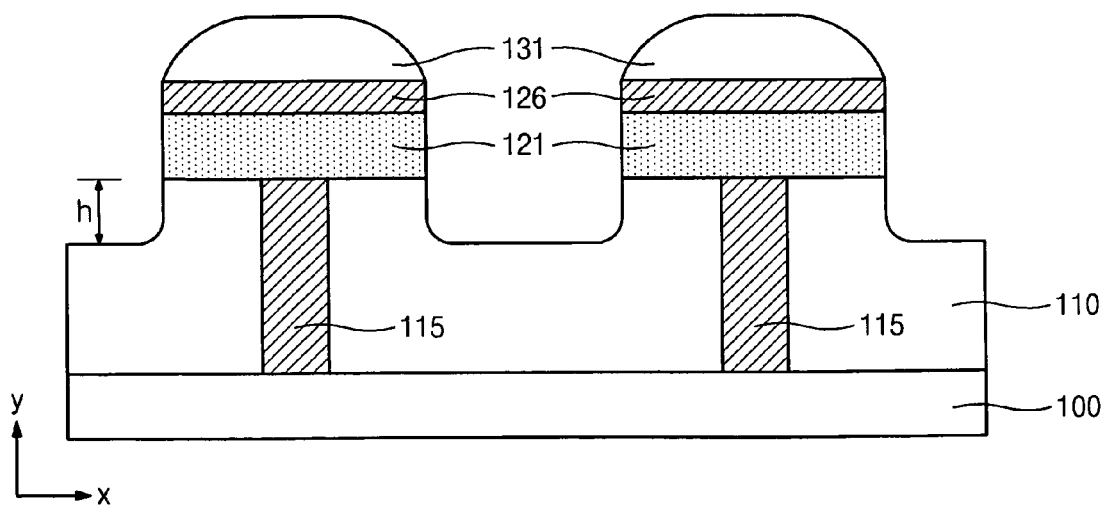

Referring to FIG. 5, the upper electrode layer 125 and the phase change layer 120 may be patterned using the hard mask pattern 131 as an etch mask to form a phase change pattern 121 and an upper electrode 126, respectively. Accordingly, the phase change pattern 121, the upper electrode 126, and the hard mask pattern 131 may be sequentially stacked on the lower electrode 115, as illustrated in FIG. 5.

The patterning of the upper electrode layer 125 and the phase change layer 120 may be performed using an anisotropic etching method. Thus, sidewalls of the phase change pattern 121 and the upper electrode 126 may be substantially perpendicular to a top surface of the semiconductor substrate 100, i.e., a surface of the semiconductor substrate 100 facing the phase change pattern 121. It is noted that since the hard mask pattern 131 may have an etch selectivity with respect to the upper electrode layer 125 and the phase change layer 120, an etchant, i.e., etch recipe, used for forming the phase change pattern 121 and the upper electrode 126 may be different from the etchant used for forming the hard mask pattern 131.

It is noted that the patterning of the upper electrode layer 125 and the phase change layer 120 may be performed using an over etch process, so a portion of the lower interlayer dielectric 110 may be recessed to a predetermined depth h, as illustrated in FIG. 5. In other words, as illustrated in FIG. 5, the lower interlayer dielectric 110 may have a vertical portion having a height h and protruding upward along the y-axis relative to the recessed portion. The recessed portion of the lower interlayer dielectric 110 may be adjacent to the phase change pattern 121, e.g., the recessed portion of the lower interlayer dielectric 110 may be between two adjacent phase change patterns 121 to surround an outer perimeter of the phase change pattern 121, so a sidewall of the vertical portion of the lower interlayer dielectric layer 110 may be substantially level with sidewalls of the phase change pattern 121 and the upper electrode 126.

Figure 6:
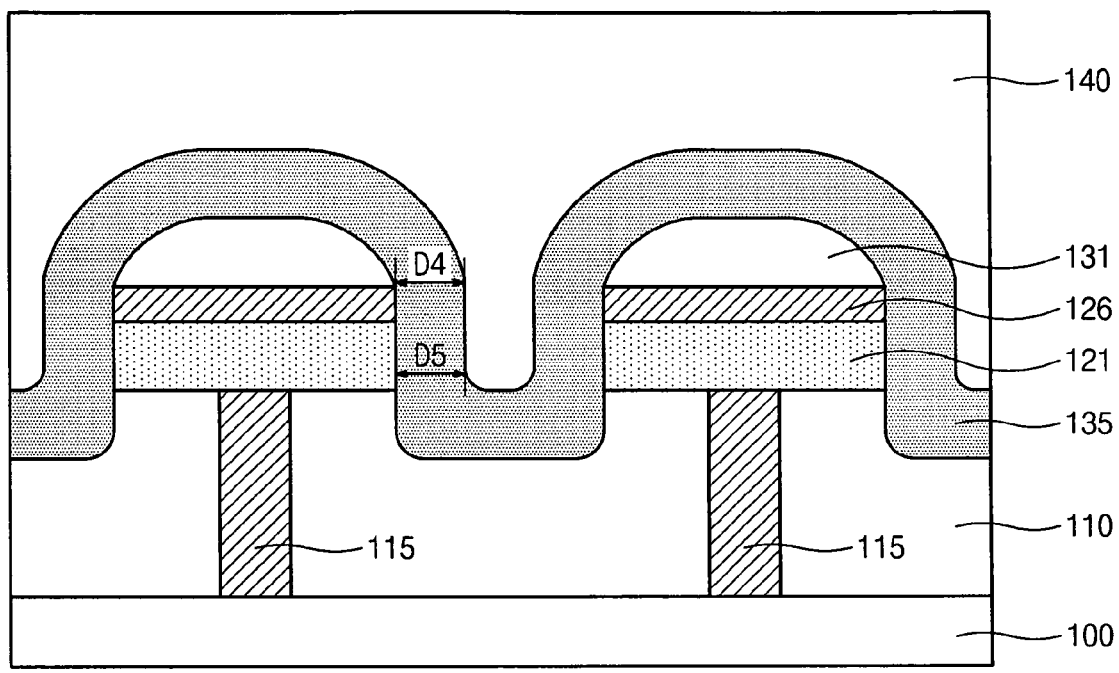

Referring to FIG. 6, a capping layer 135 and an upper interlayer dielectric 140 may be sequentially stacked on the resultant structure including the phase change pattern 121. For example, the capping layer 135 may be formed to cover the hard mask pattern 131 and sidewalls of the phase change pattern 121 and of the upper electrode 126, as illustrated in FIG. 6, so a portion of the capping layer 135 may be in the recessed portion of the dielectric 10 between two adjacent phase change patterns 121. Accordingly, the phase change pattern 121 may be enclosed between the upper electrode 126, lower electrode 115, lower interlayer dielectric 110, and capping layer 135, so impurities, e.g., oxygen, may not diffuse into the phase change pattern 121.

The capping layer 135 may have a substantially uniform thickness, and may be formed of any suitable material capable of preventing or substantially minimizing oxygen penetration therethrough into the phase change pattern 121, e.g., a silicon nitride or a silicon oxynitride. The capping layer 135 and the upper interlayer dielectric 140 may be formed at a temperature lower than a transition temperature of the phase change pattern 121 in order to prevent or substantially minimize temperature effects on the phase change pattern 121, e.g., change of a crystallization state thereof. For example, the capping layer 135 may include deposition of a silicon nitride via a PVD method. Since the PVD method may be performed at a relatively low temperature, e.g., at about 200° C., formation of the capping layer 135 at a low temperature may be satisfied.

According to example embodiments, since the sidewalls of the hard mask pattern 131 may be inclined, i.e., the bottom surface 131a may be wider than the top surface 131b, a horizontal distance, i.e., along the x-axis, between upper portions of adjacent hard mask patterns 131 may be larger than the horizontal distance between lower portions of the adjacent hard mask patterns 131. Thus, even though the low temperature PVD method is used, the capping layer 135 may exhibit improved step coverage and a substantially uniform thickness along sidewalls of the hard mask and phase change patterns 131 and 121, i.e., improved thickness uniformity in a gap between two adjacent hard mask patterns 131.

For example, the capping layer 135 may have top and side surface profiles corresponding to surface profiles of the top and side surfaces of the hard mask pattern 135, respectively. In other words, since the capping layer 135 may have a substantially uniform thickness and the hard mask pattern 131 may be inclined, e.g., curved, the profile of the top surface and sidewalls of the capping layer 135 may trace the profile of the hard mask pattern 131, e.g., portions of the capping layer 135 may be inclined at a substantially same inclination angle as the hard mask pattern 131.

Figure 2:
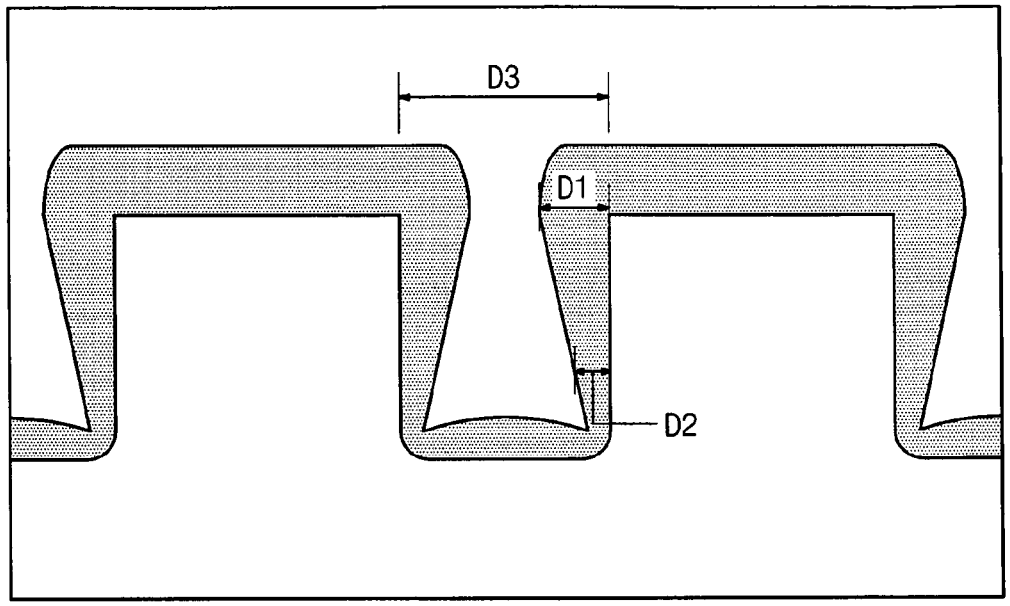
FIG. 2 illustrates a schematic cross-sectional view of a comparative deposition process of a layer on an underlying structure.

In contrast, if there were no inclined sidewalls in the hard mask pattern of the phase change memory, e.g., if the hard mask pattern had substantially same widths of the top and bottom surfaces, a capping layer formed thereon via a PVD method would have a non-uniform thickness. For example, as illustrated in FIG. 2, when a layer is deposited via a PVD method on two adjacent substantially rectangular structures, i.e., structures having substantially rectangular hard mask patterns without inclined sidewalls, in close proximity to each other, i.e., relatively small distance D3 to provide high integration, a resultant layer may be defected, e.g., may include an over-hang and/or voids. In other words, when a layer is deposited via a PVD method on two adjacent substantially rectangular structures at close proximity to each other, an upper thickness D1 of a resultant layer may be substantially larger than a lower thickness D2 thereof, as illustrated in FIG. 2, thereby forming defected capping layers and physically limiting the distance D3 between the adjacent structures.

Accordingly, a capping layer formed on a hard mask pattern according to example embodiments, i.e., on a hard mask pattern having inclined sidewalls, may have improved step coverage and increased thickness uniformity on sidewalls of underlying layers even when, e.g., a PVD method is used. It is noted that the substantially uniform thickness of the capping layer 135 may include thickness variation between upper and lower portions of the capping layer 135 of about 25% or less. For example, referring to FIG. 6, a difference between a thickness D4 of the capping layer 135 formed on the sidewall of the hard mask pattern 131 and a thickness D5 of the capping layer 135 formed on the sidewall of the phase change pattern 121 may be about 25% of the thickness D4 or less.

For example, a thickness of a capping layer according to an example embodiment may be increased by about 15% or more as compared to a maximal thickness of a conventional capping layer formed via a PVD method. In this regard, it is noted that a maximal thickness of a capping layer refers to a maximum thickness that may prevent over hanging or voids from being caused. Due to the increase of the allowed deposition thickness, the capping layer 135 according to the example embodiments may be formed to a thickness of about 400 angstroms or more, thereby providing improved impurities barrier, e.g., prevent or substantially minimize oxygen diffusion therethrough into the phase change pattern 121. As a result, reliability and operability of the phase change pattern 121 may be substantially improved, e.g., changes in the phase change patterns caused by oxygen may be efficiently prevented.

According to example embodiments, the mask layer pattern may be formed with inclined or rounded sidewalls. Thus, since an upper entrance of a gap region between adjacent hard mask patterns may be relatively wide, a step coverage of the deposited capping layer may increase. Thus, the capping layer according to example embodiments may be thicker than a conventional capping layer, e.g., a capping layer formed on a mask having no inclined sidewalls or having no rounded sidewalls, formed via a same method. Accordingly, e.g., prevention of oxygen penetration into the phase change pattern, may be substantially improved due to the increase of the available deposition thickness. Therefore, a phase change memory according to example embodiments may exhibit improved reliability and operability.

Example embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a phase change memory, the method comprising:
   forming a lower electrode on a semiconductor substrate;
   forming a phase change pattern, an upper electrode, and a hard mask pattern sequentially on the lower electrode, a width of a bottom surface of the hard mask pattern being greater than a width of a top surface of the hard mask pattern, the bottom surface of the hard mask pattern facing the upper electrode and being opposite the top surface of the hard mask pattern; and forming a capping layer to cover the top surface of the hard mask pattern and sidewalls of the hard mask pattern, phase change pattern, and upper electrode wherein the phase change pattern is enclosed by the upper electrode, the lower electrode, a lower dielectric layer surrounding the lower electrode, and the capping layer, and further comprising etching a portion of the lower dielectric layer using the hard mask pattern.

2. The method as claimed in claim 1, wherein the capping layer is formed at a temperature lower than a transition temperature of the phase change pattern.

3. The method as claimed in claim 2, wherein the capping layer is formed using a physical vapor deposition method.

4. The method as claimed in claim 1, wherein the phase change pattern is formed of a chalcogen compound, the chalcogen compound including one or more of antimony (Sb), tellurium (Te), and selenium (Se), and the capping layer is formed of at least one insulation material capable of preventing oxygen diffusion.

5. The method as claimed in claim 1, wherein forming the hard mask pattern includes gradually narrowing a width of the hard mask pattern from the bottom surface to the top surface thereof as a distance from a top surface of the upper electrode increases.

6. The method as claimed in claim 1, wherein forming the hard mask pattern includes forming a hard mask pattern with inclined sidewalls, each sidewall extending between the top and bottom surfaces of the hard mask pattern, and an inclination angle between each sidewall to the bottom surface of the hard mask pattern is about 30 degrees to about 60 degrees.

7. The method as claimed in claim 1, wherein forming the phase change pattern, the upper electrode, and the hard mask pattern includes:

sequentially forming a phase change layer, an upper electrode layer, and a hard mask layer on the lower electrode;

patterning the hard mask layer to form the hard mask pattern with the bottom surface wider than the top surface; and patterning the upper electrode layer and the phase change layer using the hard mask pattern as an etch mask, wherein an etchant used for patterning the hard mask layer is different from an etchant used for patterning the upper electrode layer and the phase change layer.

8. The method as claimed in claim 7, wherein patterning the hard mask layer includes over-etching the hard mask layer to form the hard mask pattern having the bottom surface wider than the top surface without exposing a top surface of the phase change layer.

9. The method as claimed in claim 7, wherein the hard mask layer is formed of a silicon oxide, and patterning the hard mask layer includes etching the hard mask layer under a pressure condition of about 10 mT to about 50 mT and a power condition of about 100 W to about 2000 W in a gas atmosphere including hexafluoro-1,3-butadiene ($C_4F_6$), oxygen, and argon.

10. The method as claimed in claim 1, wherein a thickness of the capping layer on sidewalls of the hard mask pattern, phase change pattern, and upper electrode is substantially uniform, the thickness being measured along a direction parallel to a line connecting two adjacent hard mask patterns.

11. The method as claimed in claim 10, wherein a difference between a thickness of a portion of the capping layer on a sidewall of the hard mask pattern and a thickness of a portion of the capping layer on a sidewall of the phase change pattern is about 25% of the thickness of the portion of the capping layer on the sidewall of the hard mask pattern or less, the thickness being measured along a direction parallel to a line connecting two adjacent hard mask patterns.

12. The method as claimed in claim 1, wherein the capping layer is formed to have a top surface profile corresponding to a surface profile of the top surface of the hard mask pattern.

13. The method as claimed in claim 1, wherein forming the phase change pattern and the upper electrode includes etching using the hard mask pattern.

14. The method as claimed in claim 13, wherein the phase change pattern, the upper electrode, and the lower surface of the hard mask pattern have the same width.

15. The method as claimed in claim 1, wherein forming the phase change pattern and the upper electrode includes etching using the hard mask pattern.

16. The method as claimed in claim 15, wherein the phase change pattern, the upper electrode, and the lower surface of the hard mask pattern have the same width.

* * * * *